United States Patent [19]

Böer

[11] 4,283,591
[45] Aug. 11, 1981

[54] PHOTOVOLTAIC CELL
[75] Inventor: Karl W. Böer, Kennett Square, Pa.
[73] Assignee: SES, Incorporated, Newark, Del.
[21] Appl. No.: 152,450
[22] Filed: May 22, 1980
[51] Int. Cl.³ .................. H01L 31/06; H01L 31/18
[52] U.S. Cl. ..................... 136/256; 29/572;
136/260; 357/30; 427/74
[58] Field of Search .............. 136/256, 260; 357/30,
357/65, 67; 427/74, 88, 117; 29/572

[56] References Cited
U.S. PATENT DOCUMENTS

| 2,820,841 | 1/1958 | Carlson et al. | 136/258 |
|---|---|---|---|
| 3,186,874 | 6/1965 | Gorski | 136/255 |
| 3,374,108 | 3/1968 | Keramidas | 427/74 |
| 3,376,163 | 4/1968 | Abrahamsohn | 136/260 |
| 3,442,007 | 5/1969 | Griffin | 228/179 |
| 3,483,038 | 12/1969 | Hui et al. | 136/244 |
| 3,888,697 | 6/1975 | Bogus et al. | 136/260 |
| 3,978,333 | 8/1976 | Crisman | 136/255 |
| 4,127,424 | 11/1978 | Ullery, Jr. | 136/244 |
| 4,143,235 | 3/1979 | Duisman | 136/258 |
| 4,167,805 | 9/1979 | Castel | 29/572 |

Primary Examiner—Aaron Weisstuch
Attorney, Agent, or Firm—Dean F. Vance

[57] ABSTRACT

A process for improving the stability of a cadmium chalcogenide/copper chalcogenide photovoltaic cell is disclosed. The improvement comprises positioning a layer of a polymer composition containing electrically conductive particles between the copper chalcogenide layer and the metal electrode such that the metal electrode does not make physical contact with the copper chalcogenide layer.

26 Claims, 4 Drawing Figures

LACK OF PUNCHTHROUGH

FIG. 3 LACK OF PUNCHTHROUGH
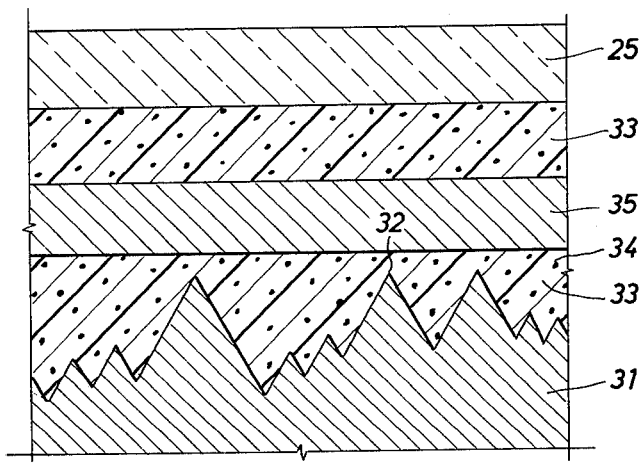
FIG. 4 PRESENCE OF PUNCHTHROUGH
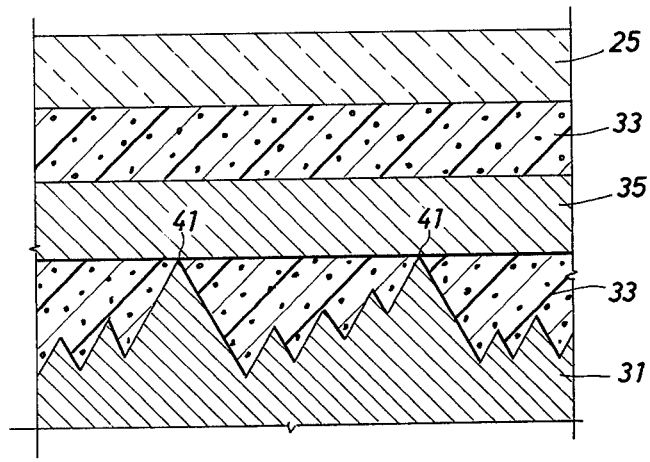

PHOTOVOLTAIC CELL

BACKGROUND OF THE INVENTION

1. Field of the Invention

This invention relates generally to photovoltaic solar cells and to a method of making the cells. More particularly, the invention relates to the improvement in stability of a copper chalcogenide/cadmium chalcogenide thin-film photovoltaic cell.

2. The Prior Art

Cadmium sulfide solar cells operate on the principle of converting light energy to electrical energy. These cells comprise a thin film of cadmium sulfide deposited on a bottom electrode. On one surface of the cadmium sulfide a film of copper sulfide is placed which forms a barrier junction between the films. Without going into an explanation of how it is generated, the incidence of light on the copper sulfide layer, or as some maintain, on the cadmium sulfide, effects a voltage and current between the cadmium sulfide layer and the copper sulfide layer. In order to collect this current from the cell, a "collector grid" is applied to the copper sulfide layer to form the top electrode. By connecting appropriate wires to the top and bottom electrodes, a circuit can be formed for the flow of electrical current.

Stoichiometry of the copper sulfide layer is considered an important factor in providing highly efficient cells. Efforts are made to provide a copper sulfide layer of chalcocite ($Cu_2S$) and to avoid other less efficient forms such as djurleite ($Cu_{1.95}S$) and digenite ($CU_{1.70}S$). For example, in U.S. Pat. No. 3,887,697 to Bogus et al and in U.S. Pat. No. 4,167,805 to Castel, a copper sulfide layer is deposited on the cadmium sulfide film and is brought to the desired stoichiometry by copper diffused from metallic copper in contact therewith.

Although efficient thin film cadmium sulfide photovoltaic cells can be formed, one of the major problems associated with such cells is the lack of stability in prolonged use. Air and moisture are common sources of degradation. In some other cases, such as when the top and bottom electrodes come into contact causing an electrical short, the source of the degradation is obvious, and means to correct the situation are also obvious. In other cases, though, the source of the degradation is not readily known. The present invention deals with a solution to such a degradation situation not previously understood.

SUMMARY OF THE INVENTION

In accordance with the present invention, a layer of a polymer containing non-metallic, electrically conductive particles is interposed between the copper chalcogenide layer and the metallic electrode such that there is substantially no physical contact between the metal electrode and the copper chalcogenide layer. Alternatively expressed, the present invention is an improvement in the process for attaching a metal electrode to the copper chalcogenide layer of a cadmium chalcogenide/copper chalcogenide photovoltaic cell, which improvement comprises positioning a layer of a polymer composition containing certain electrically conductive particles between the copper chalcogenide layer and the metal electrode such that the metal electrode is not in physical contact with the copper chalcogenide layer.

It is considered that at least part of the stability and degradation problems with $Cu_xS/CdS$ solar cells is related to the stoichiometry of the copper sulfide layer. While higher conversion efficiencies are obtained when the copper sulfide layer is substantially chalcocite ($Cu_2S$), these are degraded as the copper sulfide layer is oxidized to the higher oxidation state of copper to, for example, djurleite ($Cu_{1.95}S$) or digenite ($Cu_{1.7}S$). This can be shown by short term accelerated aging tests, the results of which are shown in the table below. As shown in the table, the short circuit current decreases as the percentage of djurleite increases in a typical cadmium sulfide/copper sulfide cell:

| Time in days of controlled accelerated conditions | Percent change in short circuit current | Percent by weight of Djurleite present |
|---|---|---|
| 1 | −6.7 | 6.7 |
| 2 | −10.8 | 11.9 |
| 4 | −17.8 | 14.0 |
| 7 | −16.9 | 18.9 |

Thus, the degradation of the cell as shown by the drop in short circuit current is indicated to be related to the percent by weight of djurleite present in the copper sulfide layer.

Without wishing to be bound to any particular theory, it is considered that when there is direct physical contact between the metal electrode and the copper chalcogenide layer, nucleation of copper from the copper chalcogenide on the metal electrode occurs. Such nucleation in turn acts as a thief or sink for copper thereby reducing the stoichiometry of the copper chalcogenide and causing degradation of the cell output, even if oxidation is prevented, e.g. by proper encapsulation. By employing the present invention and avoiding direct physical contact between the metal electrode and the copper chalcogenide layer, such nucleation is substantially impeded, as evidenced by the absence of pronounced decrease in current density between contact grid lines, hence copper cannot be taken out from the $Cu_xS$ system. With x being limited to $\leq 2$, the stoichiometry of the $Cu_xS$ must remain essentially constant, close to its original value, hence cells of improved stability are possible.

It has also been shown that prior gridded electrodes, in which the metal of the grid electrode is totally or partially in direct physical contact with the copper sulfide layer, degrade in an accelerated degradation test at a rate of about 1% per day, the test comprising continuous illumination at 60° C. with an AM 1 light source (UV-rich). This rate of degradation corresponds to an expected life of one year to a few years in normal deployment. Wire grid electrodes prepared according to the present invention show a degradation rate under the same test conditions which is slower by at least a factor of 30, i.e., a 1% degradation per month. Employing the same criteria, one might expect cells produced according to the present invention to have a life expectancy in excess of 30 years in normal deployment.

In addition to preventing physical contact, the polymer employed herein can be an adhesive to adhere the metal electrode to the semiconductor layer. The electrically conductive particles, in turn, are important in permitting transfer of the generated current between the conducting metal electrode and the copper chalcogenide layer. Without the conductive particles, the polymer alone would act as an insulator and would result in much reduced power from the cell.

The present invention also contemplates the photovoltaic cell produced by the process of the present invention. Further, the present invention also contemplates the photovoltaic cell comprising:

(a) an electrically conductive first electrode;
(b) a film of cadmium chalcogenide contacting said first electrode;
(c) a film of copper chalcogenide contacting said cadmium chalcogenide and forming a p-n junction therewith;
(d) a layer of a polymer composition containing certain electrically conductive particles in electrical contact with a portion of said copper chalcogenide film; and
(e) a second metal electrode in electrical contact with said polymer layer but not in physical contact with said copper chalcogenide layer.

BRIEF DESCRIPTION OF THE DRAWING

FIG. 3 is an expanded view of a portion of the cell taken along line 3—3 of FIG. 1, therein showing a portion of the cell according to the invention without the presence of punchthrough (as defined below).

FIG. 4 is a view similar to FIG. 3 but showing the presence of punchthrough.

DETAILED DESCRIPTION OF THE INVENTION

Figure 1:
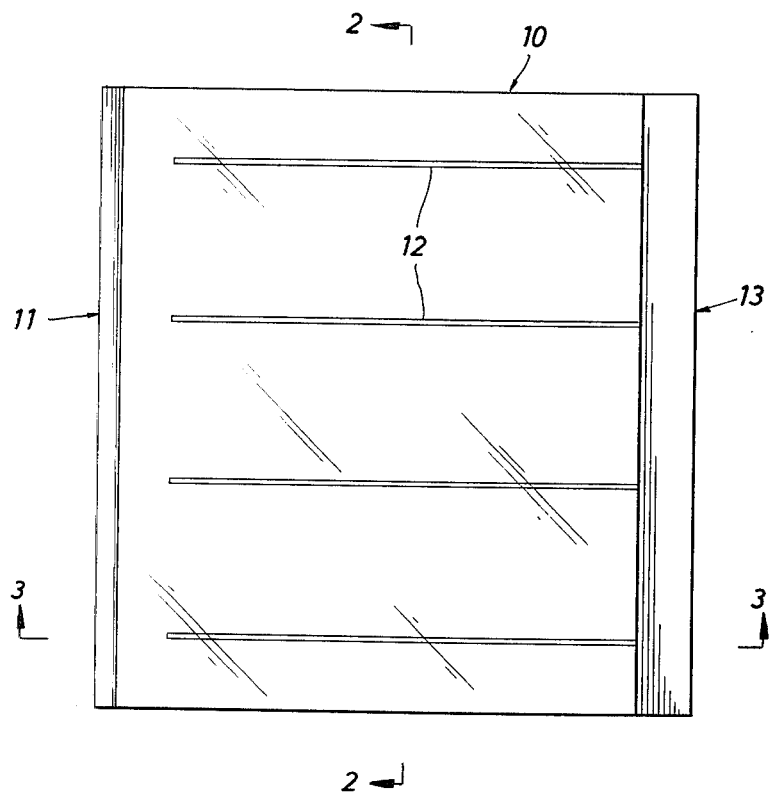
FIG. 1 is a top plan view of a cell according to one embodiment of the present invention.

The photovoltaic cells of the present invention and the general method of making them are conventional and described in the art except for applicant's improvement of providing a layer of polymer containing electrically conductive particles between the copper chalcogenide layer and the metal electrode to accomplish a specific result. Typical of such prior art cells is that of Carlson et al, U.S. Pat. No. 2,820,841, issued Jan. 21, 1958, one of the earliest patented cadmium sulfide-copper sulfide cells. The cell is further illustrated in FIG. 1. Referring to FIG. 1 of the drawing, 10 shows a single thin-film photovoltaic cell having a first electrode 11, and a second electrode 12, the wires of the second electrode terminating in a buss 13. Since each commonly known, individual solar cell generates only a small amount of power, usually much less power than is required for most applications, the desired voltage and current is realized by interconnecting a plurality of solar cells in a series and parallel matrix. This matrix is generally referred to as a solar cell array, and generates electrical energy from solar radiation for a variety of uses.

The photovoltaic cell may be either a front-wall cell, a back-wall cell or a combination of both. In a front-wall cell, light enters the cell directly on the absorber (Cu$_2$S) layer. For this type of cell the electrode in contact with the absorber layer must allow light to pass through and is usually grid-like. For the front-wall cell, the other electrode and the substrate are not required to be transparent. Front-wall cells are illustrated in U.S. Pat. No. 4,127,424.

In a back-wall cell, the sunlight hits directly on the CdS layer. Accordingly, the electrode substrate contacting the CdS layer and the substrate must be transparent, whereas the other electrode need not be. Typically, the support substrate for a back-wall cell is transparent glass or plastic and the electrode in contact with the CdS layer is conductive tin oxide, indium oxide or mixtures thereof. A back-wall cell is illustrated in U.S. Pat. No. 4,143,235. The cell may also be a combination of a front-wall and a back-wall cell as illustrated by U.S. Pat. No. 3,376,163.

With back-wall cells, the polymeric layer can cover the entire Cu$_2$S surface. However, with front-wall cells, since light must be available to the Cu$_2$S surface, it is most convenient to incorporate the polymeric coating directly on the metal electrode.

Figure 2:
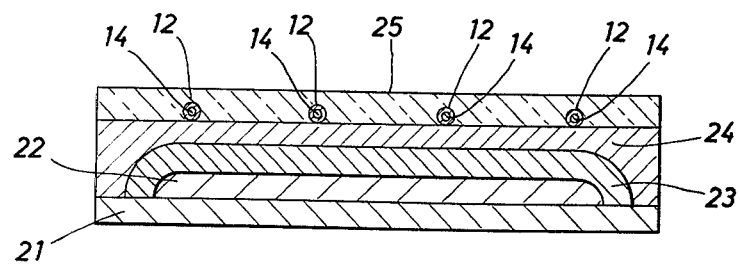
FIG. 2 is a cross-sectional view of the cell taken along line 2—2 of FIG. 1 showing the layers of the individual cell. This cross-sectional view is not to scale since it would not be practical to show in a drawing the true thickness of the electrode and cell elements.

The present invention is concerned with the preparation of cells having improved stability, specifically, with the attachment of a metal electrode to the copper chalcogenide layer in such a manner as to avoid direct physical contact between the metal electrode and the copper chalcogenide layer. FIG. 2 illustrates the attachment and provides a cross sectional view of the cell taken along line 2—2. While the remainder of the discussion and FIGS. 1 and 2 deal specifically with front-wall cells, this is not meant to limit the invention.

Referring to FIGS. 1 and 2, the first step in forming a cell is to coat a substrate 21 with a conductive layer to form the first electrode 22. Typical substrates include glass, plastics, metals or ceramics. Various substrates are disclosed in U.S. Pat. Nos. 3,483,038, 3,376,163, and 4,127,424. The first electrode or conductive layer usually comprises a conductive metal such as zinc, copper or silver. More than one layer of metal may be deposited on the substrate if desired. In some cases the substrate may also be the first electrode, e.g., a molybdenum substrate. In addition, a thin film of an electrically conductive metal such as zinc may additionally be applied to the electrode to provide improved ohmic contact.

Upon this first electrode a cadmium chalcogenide film 23 is deposited. As used in the specification and claims, the term "chalcogenide" refers to the group consisting of the elements oxygen, sulfur, selenium, tellurium and polonium. Preferred chalcogenide elements are sulfur, tellurium and selenium. Much preferred is sulfur. The remainder of the specification will refer to the sulfide, but is not intended to limit the invention. The deposition of the cadmium sulfide film can be done in a known manner, such as through a suitably apertured mask from the vapor state. The thickness of the layer can be about 20 microns to about 100 microns, as disclosed by Gorski, U.S. Pat. No. 3,186,874, or thinner. The cadmium sulfide film 23 covers and completely overlaps all but a small portion of the bottom or first electrode. The uncovered portion can be used subsequently either for electrical connecting means to an adjacent cell, such as the second or top electrode of an adjacent cell to make a series connection therewith, or for a negative output terminal. When the substrate is insulating, as shown, the cadmium sulfide film 23 in each of the cells overlaps the remaining periphery of the bottom electrode and extends to the surface of substrate 21 in order that the subsequent overlapping films and the top electrode in each cell do not contact the bottom electrode layer 22.

The surface of the cadmium sulfide film 23 may be etched with hydrochloric acid for about 4-5 seconds, if desired, before the cuprous sulfide film is formed therein, as described in U.S. Pat. No. 3,480,473. The cuprous sulfide film 24 is formed in a suitable fashion such as, for example, deposition of cuprous chloride from the vapor state through a suitably apertured mask over the cadmium sulfide film 23, or by contacting the cadmium sulfide film 23 with an aqueous solution of a cuprous salt as, for example, a cuprous chloride or bromide solution, as described in Keramidas, U.S. Pat. No. 3,374,108. The cuprous sulfide film 24 will have a thickness typically between about 500 Å and about 10,000 Å.

The present invention deals specifically with the interposing of a polymeric layer between the metal electrode and the copper chalcogenide layer. Examples of some types of electrodes are disclosed in U.S. Pat. Nos. 3,442,007; 3,888,697 and 3,978,333. For front-wall cells, a preferred electrode is the wire grid electrode disclosed in copending U.S. patent application Ser. No. 68,791, filed Aug. 22, 1979, entitled "Electrode for Photovoltaic Cell," and having a common assignee. The remainder of the disclosure will refer to the wire grid technology, but is not intended to limit the application of the present invention. For instance, the present invention has application in a similar fashion to a continuous (or non-continuous) sheet electrode for back-wall cells wherein a polymer containing certain electrically conductive particles is interposed between the $Cu_2S$ layer and the sheet electrode.

In a specific preferred embodiment of the present invention the top electrode comprises an electrically conductive metal wire 14 coated with a polymer 12 containing certain electrically conductive particles. This coated wire is placed on the cuprous sulfide surface in the desired pattern and becomes attached to the cuprous sulfide layer by application of moderate heat and/or pressure to provide the top electrode. Typical conducting metals used for the wire include gold, copper, nickel and silver. The term "wire" is used in its usual sense as an elongated, generally circular cross-sectioned, slender, usually flexible, metal having a diameter of between about 0.0001 inches and about 0.005 inches, preferably between about 0.001 inches and about 0.003 inches. Preferred is copper wire having a diameter of about 0.0025 inches. Other cross-sectioned shapes, such as square, rectangular, oval, etc., can be used if desired.

An important aspect of the present invention is that the polymer coating must contain electrically conductive particles so as to permit transfer of the generated current between the conducting metal wire and the cuprous sulfide layer. Without the conductive particles, the polymer alone would act as an insulator and would result in much reduced power from the cell. Sufficient type and quantity of particles are required to provide ohmic contact between the metal wire and cuprous sulfide layer. As defined at page 416 of *Physics of Semiconductor Devices,* Wiley Interscience, New York 1969 S. M. Sze, an ohmic contact is "a contact which will not add a significant parasitic impedance to the structure on which it is used, and it will not sufficiently change the equilibrium carrier densities within the semiconductor to affect the device characteristics." In practice, the above ideal ohmic contact can only be approximated. An ohmic contact can also be defined as a low resistance, non-rectifying type of contact. As for the relative amounts of polymer and particles, too small a quantity of particles results in little or no ohmic contact while too large a quantity of particles results in too little binder and the possibility of fabrication problems. The polymer coating of the wire in general contains between about 5 and 95 percent by weight electrically conductive particles, preferably between about 20 and about 80 percent by weight.

The term "electrically conductive particles" as used in the specification and claims includes electrically conductive carbon particles and certain electrically conductive non-metallic particles, such as conductive oxides. Preferred conductive carbon particles include conductive carbon blacks and crystalline graphite, with crystalline graphite being particularly preferred. Particularly good conductive oxides are induim oxides, tin oxides, silver oxides and copper oxides. Due to a variety of reasons, including lower cost, the much preferred electrically conductive particle is crystalline graphite.

Suitable polymers employed in coating the wire may be either thermoplastic or thermosetting. These polymers preferably should be non-brittle, possess good ultraviolet resistance, be chemically non-poisonous and should adhere to the cuprous sulfide film upon application of moderate heat and pressure. Further, the polymer should be one into which the conductive particles may be adequately dispersed. Still further, suitable polymers are those which can be uniformly coated onto the wire. A preferred polymer is a fluoroelastomer material, such as that disclosed in U.S. Pat. Nos. 3,870,987, 3,661,831 and 3,900,654. Suitable fluoroelastomers include vinyl/olefinic fluoroelastomeric polymers, vinylfluorocarbon elastomeric copolymers, vinylidene/fluoroolefinic elastomeric polymers, and $C_2$–$C_4$ olefinic/fluorocarbon elastomeric copolymers. A much preferred material is the vinylidene fluoride/hexafluoropropene copolymer fluoroelastomer. Commercially available fluoroelastomers include DuPont's VITON B polymer and 3M's Fluorel polymer. These polymers are typically employed in a solution. Typical solvents include ketones such as methyl-ethyl ketone, acetone, dimethylformamide, isophorone, and the like. A much preferred solution of these polymers containing suspended graphite is available from Acheson Colloids Company under the tradename Electrodag +502 SS. This material contains about 10% by weight crystalline graphite, about 12% by weight VITON B polymer, about 78% by weight isophorone solvent and a curing agent. The VITON B polymer is a vinylidene fluoride/hexafluoroprene copolymer fluoroelastomer.

The process employed for coating the wire with the polymer/conductive particle mixtures will vary depending upon the coating thickness required, type of polymer, type of conductive particle, relative amount of polymer/conductive particle, among other factors. For example, when the chosen polymer is a thermoplastic polymer, such as a styrene-diene block copolymer, selectively hydrogenated styrene-diene block copolymer, and the like, the polymer coating may be easily applied by known wire coating extrusion techniques. Alternatively, the thermoplastic polymer may be applied as a suspension by passing the wire through a suspension of particles in the polymer solution, running the coated wire through a die and then running the coated wire through an evaporator or drying oven to remove the solvent. When the polymer employed is a thermosetting polymer, such as an epoxy polymer, the coating technique employed is slightly more complex. Briefly, the wire is passed through a dispersion of the polymer/conducting particle mixture in a solvent, then passed through a die, and then passed through a heater or dryer to remove the solvent. Regarding thermosetting polymers, the temperature and conditions during the drying step should be sufficient to remove the solvent while not being so severe that the polymer becomes crosslinked or set. The final cure or crosslinking will occur after the coated wire is attached to the cell. By way of specific example, when employing the Acheson Electrodag solution, the wire is first passed through the solution, then run through a die and then dried or baked at a temperature of about 80°-95° C. for a short time, e.g., about 2 or 3 seconds. This may be repeated to produce a thicker and more even coating if necessary. The curing of this resin requires the application of higher heat (about 200° C.) and a longer bake time (about 15 to 20 minutes).

A most important aspect of the present invention is that the polymer layer should be sufficiently thick to provide adhesion to the cell and to prevent punchthrough of the cuprous sulfide layer to the metal electrode. FIG. 3 refers to an expanded cross-sectional view of the cell of FIG. 1 takes along line 3—3. Referring to FIG. 3, the surface of the cuprous sulfide layer 31 is not perfectly smooth in a microscopic sense and has sharp peaks 32 and valleys. The polymer layer 33 containing electrically conductive particles 34 must be thick enough so that there is no physical contact with the metal electrode 35. FIG. 4 is similar to FIG. 3 except that it shows the presence of punchthrough or physical contact between the cuprous sulfide layer and the metal electrode. It can be seen in FIG. 4 that the peaks in the cuprous sulfide layer 31 have made physical contact 41 with the metal electrode 35. These points of contact or punchthrough provide cites for copper nucleation with encompanying copper migration. This copper migration eventually results in degradation of the cell as explained in the summary of the invention.

In a specific embodiment, the polymer coating is substantially uniform having a thickness of between 0.25 mils and about 2 mils, more preferably between about 0.5 mils and about 1 mil.

In the specific embodiment disclosed above, the coated wire is placed on the cuprous sulfide layer to serve as the top electrode. The structure or form of the electrode may vary depending upon a number of factors. The top electrode may comprise simply a single wire running across the cell, a number of parallel wires running across the cell, or a number of wires woven into a matrix similar to that shown in U.S. Pat. No. 3,442,007. These include etched or stamped-out grids or any other gird configuration, provided that the portions of the grid which face the Cu$_x$S layer are coated with the above mentioned polymer coating and any punchthrough is avoided. Other variations are also within the scope of the present invention. The solid polymeric coating on the wire permits the manufacturer to use a wide variety of techniques to form the top electrode. A simple procedure is merely to place the wires across the surface of the cells in a uniform parallel manner by use of a turning lathe. The wires of the electrode are then attached to a buss or terminal, such as the buss 13 shown in FIG. 1.

In forming the top electrode for front-wall cells it is important to retain as much open space as possible for the light to contact the cuprous sulfide layer. Ideally, maximum power is attained with maximum area exposed to light. However, multiple conductors are generally required to provide short current paths for collection of the current generated. About 80 to about 95 percent or more open space is preferred. Because of the ability to employ multiple thin wires coated with a thin polymer layer, it is possible to produce cells having a higher percentage of open space while maintaining low sheet resistance loss. Wire spacings of about 20 wires per inch to about 80 wires per inch are typical.

After the coated wire is placed on the cell, moderate heat and/or pressure is applied. The heat and pressure allow uniform contact with the cuprous sulfide layer along the wire, resulting in better ohmic contact with the cuprous sulfide film. When it is desired to crosslink a reactive elastomeric polymer, such as is the case when Acheson Electrodag is used, supplemental crosslinking agents may also be employed. Temperatures employed with the Acheson Electrodag are in general between about 150° C. and about 230° C., preferably between about 200° C. and about 210° C. Pressures with the Acheson Electrodag are in general between about 15 psi and about 100 psi, preferably between about 20 psi and about 75 psi. The appropriate temperature and pressure for each application depends primarily upon the particular polymer employed and the thickness of the polymer coating. However, the temperature and pressure should not be such as to result in punchthrough from the cuprous sulfide layer to the metal electrode.

The finished cell assembly is then usually sealed with a protective light transmitting coating or a protective film or plate 25 of a material such as glass or the like. The protective film should be impervious to oxygen and water vapor which would degrade the cell.

In operation, the cell converts light into electrical energy when exposed to light. In each cell, light energy passes through the area not covered by top electrode wires to the cuprous sulfide film 24 where it is at least partially absorbed thereby causing a voltage between the bottom electrode and the top electrode. Since this voltage for a photovoltaic, cadmium sulfide cell is typically about 0.4-0.5 volts, cells are connected in series to provide a desired voltage. The current capacities at the desired voltage may be increased by connecting a plurality of the serially connected rows of cells in parallel.

What is claimed is:

1. A process for improving the stability of a cadmium chalcogenide/copper chalcogenide photovoltaic cell having a metal electrode in electrical contact with the copper chalcogenide layer, which process comprises positioning a layer of a polymer composition containing electrically conductive particles between said copper chalcogenide layer and said metal electrode such that said metal electrode is not in physical contact with said copper chalcogenide layer.

2. The process according to claim 1 wherein said copper chalcogenide is copper sulfide and said cadmium chalcogenide is cadmium sulfide.

3. The process according to claim 2 wherein said electrically conductive particles are selected from the group consisting of electrically conductive carbon particles and electrically conductive metal oxides.

4. The process according to claim 3 wherein said electrically conductive particles are selected from the group consisting of conductive carbon blocks and crystalline graphite.

5. The process according to claim 4 wherein said electrically conductive particles are crystalline graphite particles.

6. The process according to claim 5 wherein said metal electrode is a copper wire.

7. The process according to claim 6 wherein said polymer composition is coated onto said metal electrode prior to attachment to said copper sulfide layer.

8. The process according to claim 7 wherein said polymer is a vinylidene fluoride/hexafluoroprepene copolymer.

9. The process according to claim 3 wherein said metal oxides are selected from the group consisting of indium oxides, tin oxides, silver oxides and copper oxides.

10. The process according to claims 1 or 2 wherein the thickness of said polymer composition is between about 0.25 mils and about 2 mils.

11. The process according to claim 1 wherein said photovoltaic cell is a front-wall cell.

12. The process according to claim 1 wherein said photovoltaic cell is a back-wall cell.

13. A stable photovoltaic cell produced by the process of claims 1 or 2.

14. A photovoltaic cell having improved stability comprising:
(a) an electrically conductive first electrode;
(b) a film of cadmium chalcogenide contacting said first electrode;
(c) a film of copper chalcogenide contacting said cadmium chalcogenide and forming a p-n junction therewith;
(d) a layer of a polymer composition containing electrically conductive particles in electrical contact with a portion of said copper chalcogenide film; and
(e) a second metal electrode in electrical contact with said polymer layer but not in physical contact with said copper chalcogenide layer.

15. The cell according to claim 14 wherein said copper chalcogenide is copper sulfide and said cadmium chalcogenide is cadmium sulfide.

16. The cell according to claim 15 wherein said electrically conductive particles are crystalline graphite particles.

17. The cell according to claim 16 wherein said metal electrode is a copper wire.

18. The cell according to claim 17 wherein said polymer composition is coated onto said metal electrode prior to attachment to said copper sulfide layer.

19. The cell according to claim 18 wherein said polymer is a vinylidene fluoride/hexafluoroprepene copolymer.

20. The cell according to claim 14 wherein said electrically conductive particles are selected from the group consisting of electrically conductive carbon particles and electrically conductive metal oxides.

21. The cell according to claim 20 wherein said electrically conductive particles are selected from the group consisting of conductive carbon blocks and crystalline graphite.

22. The cell according to claim 20 wherein said metal oxides are selected from the group consisting of indium oxides, tin oxides, silver oxides and copper oxides.

23. The cell according to claim 14 or 15 wherein the thickness of said polymer composition is between about 0.25 mils and about 2 mils.

24. The cell according to claim 14 wherein said photovoltaic cell is a front-wall cell.

25. The cell according to claim 24 wherein the copper sulfide surface area blocked by said electrode and said polymer composition is between about 5 percent and about 20 percent.

26. The cell according to claim 14 wherein said photovoltaic cell is a back-wall cell.

* * * * *